(12) United States Patent
Oh et al.

(10) Patent No.: US 7,294,577 B2
(45) Date of Patent: Nov. 13, 2007

(54) METHOD OF MANUFACTURING A SILICIDE LAYER

(75) Inventors: Junji Oh, Akiruno (JP); Yuka Hayami, Hamura (JP); Ryou Nakamura, Tachikawa (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 11/088,984

(22) Filed: Mar. 24, 2005

(65) Prior Publication Data

US 2005/0215003 A1 Sep. 29, 2005

(30) Foreign Application Priority Data

Mar. 25, 2004 (JP) .............................. 2004-089052

(51) Int. Cl.
*H01L 21/311* (2006.01)
(52) U.S. Cl. ...................... 438/694; 438/756; 438/682; 257/E21.229; 216/83
(58) Field of Classification Search ................ 438/276, 438/694, 745, 756, 906, 233, 751, 696, 725; 216/83; 257/E21.229
See application file for complete search history.

(56) References Cited

U.S. PATENT DOCUMENTS

| | | | | |
|---|---|---|---|---|
| 6,211,055 | B1* | 4/2001 | Peng et al. | 438/618 |
| 6,492,275 | B2* | 12/2002 | Riley et al. | 438/696 |
| 6,664,196 | B1* | 12/2003 | Wada et al. | 438/754 |
| 2005/0148197 | A1* | 7/2005 | Woods et al. | 438/745 |

OTHER PUBLICATIONS

Wolf et al., Silicon Processing for the VLSI Era, vol. 1: Process Teachnology, 1986 by Lattice press, pp. 564-565.*

* cited by examiner

*Primary Examiner*—Matthew Smith
*Assistant Examiner*—Julio J. Maldonado
(74) *Attorney, Agent, or Firm*—Staas & Halsey LLP (57) ABSTRACT

There is provided a method of manufacturing semiconductor device comprising removing an organic substance from a semiconductor surface having an oxide film thereon, the semiconductor surface being formed to have a line width of 50 nm or less; removing the oxide film from the semiconductor surface; drying the semiconductor surface without using an organic solvent; and forming a silicide layer on the semiconductor surface after drying the semiconductor surface.

19 Claims, 6 Drawing Sheets

FIG. 5

METHOD OF MANUFACTURING A SILICIDE LAYER

CROSS-REFERENCE TO RELATED APPLICATIONS

This application is based upon and claims Priority of Japanese Patent Application No. 2004-089052, filed on Mar. 25, 2004, the contents being incorporated herein by reference.

BACKGROUND OF THE INVENTION

In miniaturizing certain semiconductor devices, pre-processing may be required to form a silicide layer. In miniaturized semiconductor devices, shallow diffusion regions are formed, and the size of the gate electrode, formed of silicon, is reduced. To form the shallow diffusion regions and to form a gate electrode having a lower resistance, a self-aligned silicide layer is proposed. The silicide layer is formed to the shape of a silicon region.

In salicide technology, a metal, such as cobalt, is first deposited on a silicon substrate having an insulating region formed therein. Next, the silicon substrate is annealed to form a silicide layer through a silicide reaction between the silicon and the metal. The silicide layer is selectively formed by removing the metal which has not yet reacted.

In order to form a good silicide layer, the surface of the silicon substrate should be rinsed to remove a native oxide film. Rinsing should occur before forming the metal film. If the native oxide film is not removed, it will interfere with a diffusion process that occurs between the silicon and metal. In this case, insufficient silicide reaction occurs and thereby a silicide layer having lower resistance cannot be formed.

The above described salicide technology is described, for example, in Japanese Published Unexamined Patent application No. 2002-334850 (Published on Nov. 22, 2002) Corresponding U.S. Pat. No. 6,475,893 B2 (Published on Nov. 5, 2002).

However, with still further miniaturization of semiconductor devices, fluctuations in the uniformity of the silicide layer and fluctuations in silicide resistance are problems that occur even if one or more of the known cleaning processes is performed. Accordingly, a better cleaning method is required for the smaller devices.

SUMMARY OF THE INVENTION

Therefore, one possible object is to provide a method of manufacturing a semiconductor device including the silicide layer having excellent uniformity.

The inventors propose a method of manufacturing a semiconductor device that reduces fluctuations in the silicide resistance. More specifically, the inventors propose removing an organic substance from a semiconductor surface before forming a silicide layer in the semiconductor region, which the silicide layer is to be formed to have a line width of 50 nm or less. An oxide film on the semiconductor surface is removed, and the semiconductor surface is dried by a drying process that does not use an organic solvent.

A chemical solution is used in the cleaning process before forming the silicide layer. In the cleaning process, the native oxide film, a chemical oxide film, and any pre-silicide altered layer on the silicon surface are all removed. By greatly reducing the amount of organic substances which remain on the silicon, fluctuations in the resistance of the polysilicon gate electrode are reduced. This is true even if the gate length is 50 nm or less, and the gate electrode is used for an nMOS transistor.

BRIEF DESCRIPTION OF THE DRAWINGS

These and other objects and advantages will become more apparent and more readily appreciated from the following description of the preferred embodiments, taken in conjunction with the accompanying drawings of which.

DETAILED DESCRIPTION OF THE PREFERRED EMBODIMENTS

With further micro-miniaturization of semiconductor devices, the line width of the gate electrode is progressively shortened. Accordingly, it has been proven that a parasitic resistance in the gate electrode increases, and fluctuations in the resistance of the gate are also generated. In addition to reducing the line width, the gate electrode is now exposed to a greater variety of atmospheric conditions because more processes are being performed. These atmospheric conditions occur, for example, during an etching process, an ion implantation process, and an ashing process. It is believed that the varying atmospheric conditions alter the surface of the fine gate electrode and have a negative influence on the uniformity of the silicide layer.

Figure 1A:
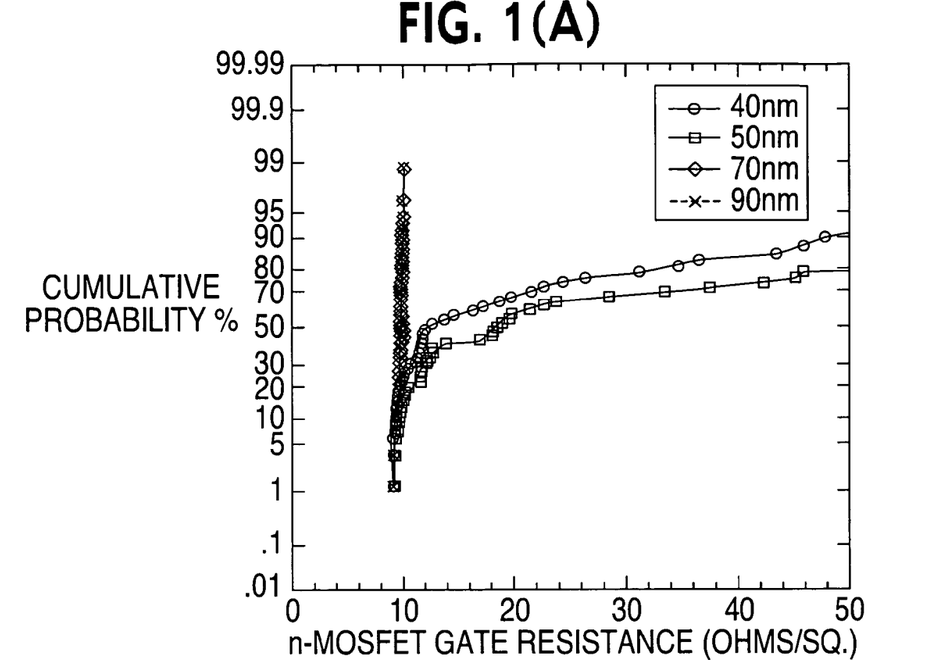
FIG. 1A is a cumulative probability graph of gate resistance in n-channel MOS transistors.
Figure 1B:
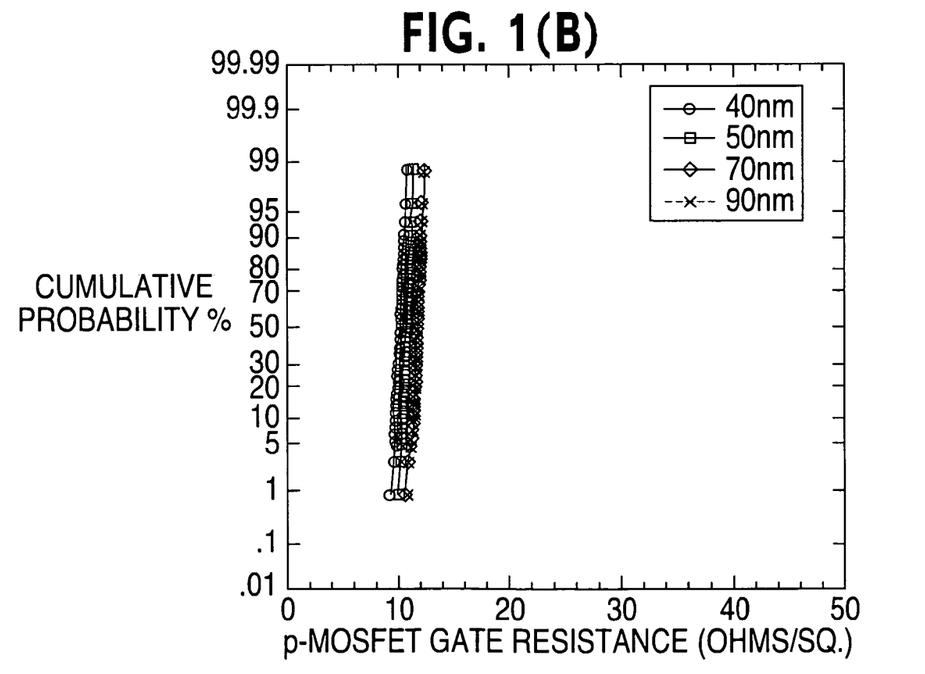
FIG. 1B is a cumulative probability graph of gate resistance in p-channel MOS transistors.

FIG. 1A is a cumulative probability graph of the gate resistance in n-channel MOS transistors. FIG. 1B is a cumulative probability graph of the gate resistance in p-channel MOS transistors. In these figures, the cumulative probability is plotted on the vertical axis, while the gate resistance is on the horizontal axis. The n-channel MOS transistors and the p-channel MOS transistors were formed with methods which will be described later in detail. However, for pre-cleaning before the silicide forming process, a process using an Ammonia hydroxide/hydrogen peroxide mixture, and a diluted hydrofluoric acid process were performed. In a drying process, an organic solvent was introduced. Thereafter, a cobalt film was formed, and heat treatment and wiring processes were performed. The gate resistance was measured for transistors having gate lengths of 40, 50, 70, 90 nm. Measurements were taken at 43 measuring points on the wafer surface for each of the 40, 50, 70 and 90 nm gate length transistors. This data shows that the gate resistance fluctuates on the wafer surface for n-channel MOS transistors having a gate length of 50 nm or less.

In the Ammonia hydroxide/hydrogen peroxide mixture cleaning process, wafers are processed with a solution having an $NH_4OH:H_2O_2:H_2O$ ratio of 1:2:110. The wafers are processed at a temperature of 40° C., using the batch type cleaning apparatus. In the diluted hydrofluoric acid cleaning process, wafers are processed with a solution having an $HF:H_2O$ ratio of 1:220. The wafers are processed at room temperature, using the batch type cleaning apparatus. In addition, in the drying process, wafers are subjected to the Marangoni drying method using isopropyl alcohol (IPA).

Figure 2:
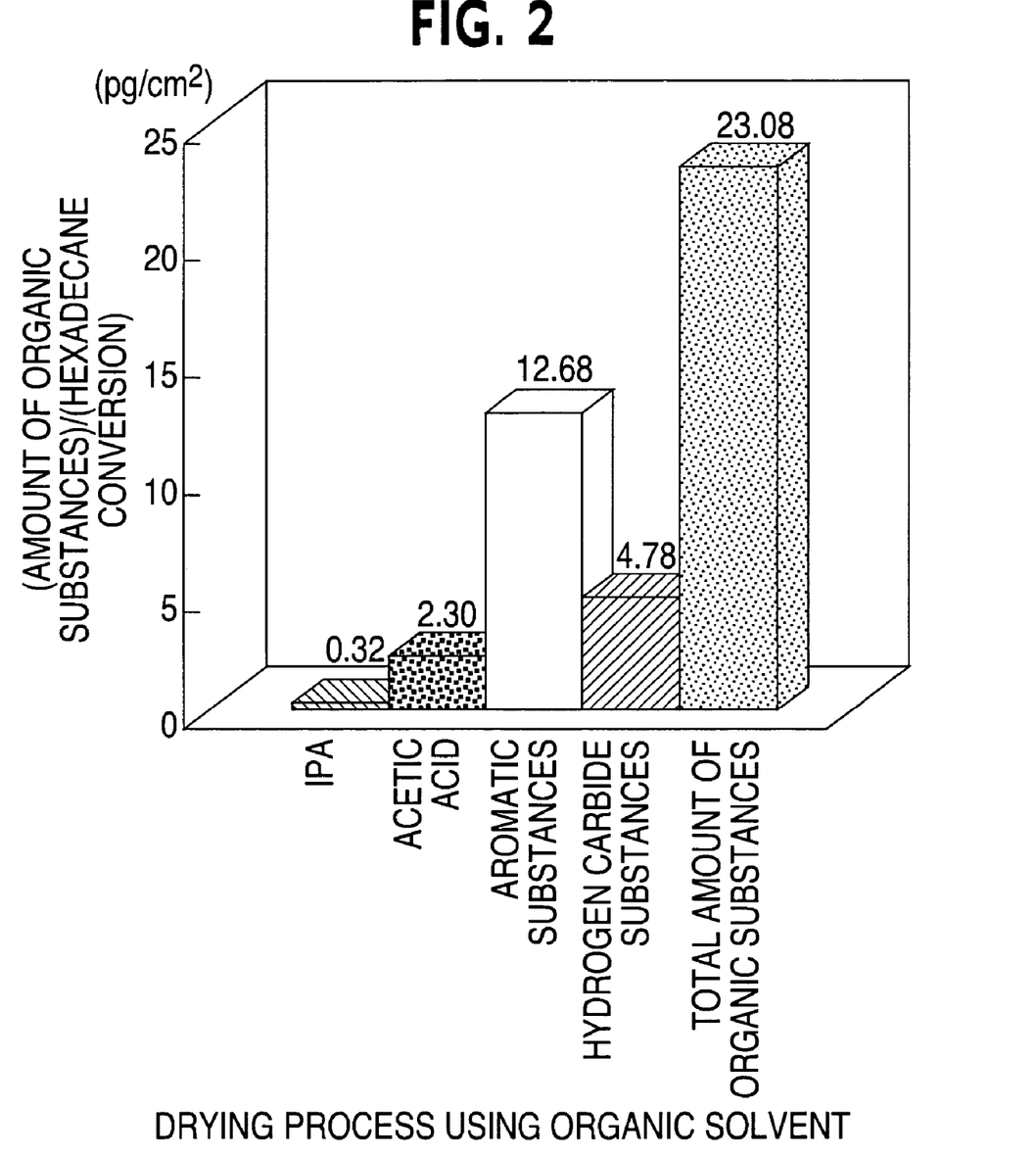
FIG. 2 is a diagram illustrating amount of organic substances existing on the wafer surface after the Marangoni drying process.

FIG. 2 is a diagram illustrating the amount of organic substances existing on the wafer surface after the Marangoni drying process mentioned above. In this figure, the amount of organic substances after the hexadecane conversion is plotted on the vertical axis, while the various organic substances are identified on the horizontal axis. The organic substances were measured using a gas chromatographic mass analysis (GCMS). As a result, the total amount of organic substances in the wafer was determined to be 23.08 $pg/cm^2$. Four kinds of organic substances were found, IPA, acetic acid, aromatic substances, and hydrogen carbide. These organic substances are thought to be formed during processing and not removed by the Ammonia hydroxide/hydrogen peroxide mixture process and diluted hydrofluoric acid process. Alternatively, these organic substances could be remnants on the wafer surface from chemicals used during the Maragoni drying process.

Therefore, although the detail mechanism is not yet analyzed, it has been proven that when the line width of the gate electrode is shortened to 50 nm or less, parasitic resistance in the gate electrode rises and resistance fluctuates. Moreover, damage is generated on the gate electrode because the electrode is exposed to various environmental conditions during processes such as an etching process, an ion implantation process, and an ashing process or the like. These processes are thought to alter the surface of the fine gate electrode and detract from uniformity in the formation of the silicide. Moreover, with regard to differences between pMOS gate electrodes and nMOS gate electrodes, the different implanted species influence the difference quality and thickness of a film, which is believed to form on the surface of the gate. This film in turn influences the resistance. Referring to FIGS. 1A and 1B, p-MOSFETs do not experience the same problems as n-MOSFETs.

The method of manufacturing a semiconductor device according to one possible embodiment of the invention will be described with reference to FIGS. 3A to 3H. FIGS. 3A to 3H are cross-sectional views of the processes illustrating the method of manufacturing a semiconductor device based on one embodiment of the present invention.

Figure 3A:
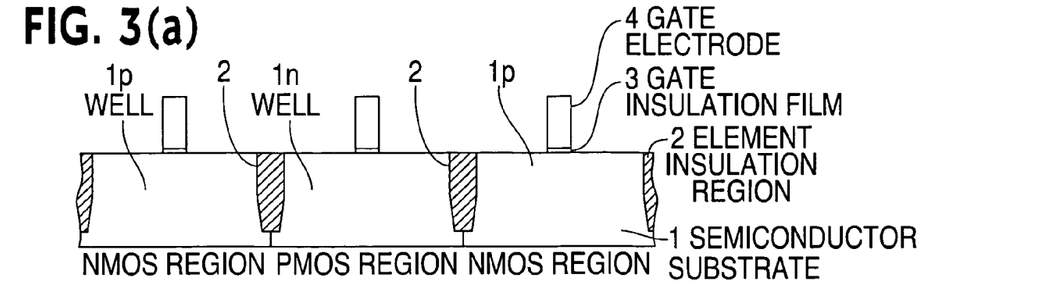
FIGS. 3A to 3H are cross-sectional views of processes illustrating the method of manufacturing a semiconductor device on the basis of one embodiment of the present invention.

First, as illustrated in FIG. 3A, isolation 2 for defining a device region is formed on a semiconductor substrate 1. The semiconductor substrate is for example, formed of silicon, polysilicon or silicon germanium. The isolation 2 can be formed, for example, with an STI (Shallow Trench Isolation) method.

Next, a p-well 1$p$ is formed in the semiconductor substrate 1 in the region where the nMOS transistor is to be formed. The p-well is formed by ion implantation of a p-type impurity using the photolithography. Similarly, an n-well 1$n$ is formed in the semiconductor substrate 1 in the region where the pMOS transistor is to be formed. The n-well is formed by ion implantation of an n-type impurity.

Moreover, a gate insulation film 3 having a thickness of 1 nm to 2 nm is formed on the semiconductor substrate 1. A polysilicon film having a thickness of about 100 nm is also formed on the gate insulation film 3. Thereafter, gate electrodes 4 having a gate length of 30 nm to 50 nm are formed by patterning a polysilicon film using the photolithography.

Figure 3B:
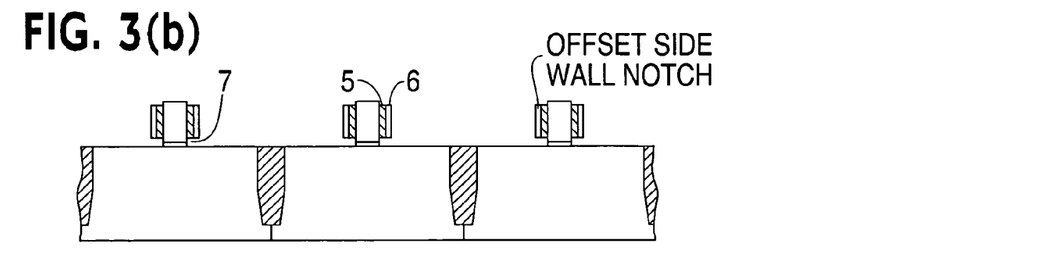

As illustrated in FIG. 3B, a silicon oxide ($SiO_2$) film 5 having a thickness of 15 nm is formed on the gate electrode 4 and the silicon substrate 1 with an evacuated plasma CVD method using, for example, TEOS as the source gas. A silicon nitride (SiN) film 6, for example, in the thickness of 5 nm is formed on the silicon oxide film 5 with a CVD method using silane ($SiH_4$) and ammonium ($NH_3$). Subsequently, anisotropic etching is performed almost in the vertical direction to the upper surface of the semiconductor substrate 1 to leave the silicon nitride film 6 at the side wall of the gate electrodes 4. In addition, an offset side wall notch 7 including the silicon oxide film 5 and the silicon nitride film 6 is formed by anisotropic etching of the silicon oxide film 5 using the silicon nitride film 6 as a mask. FIG. 3B shows the device after anisotropic etching.

Figure 3C:
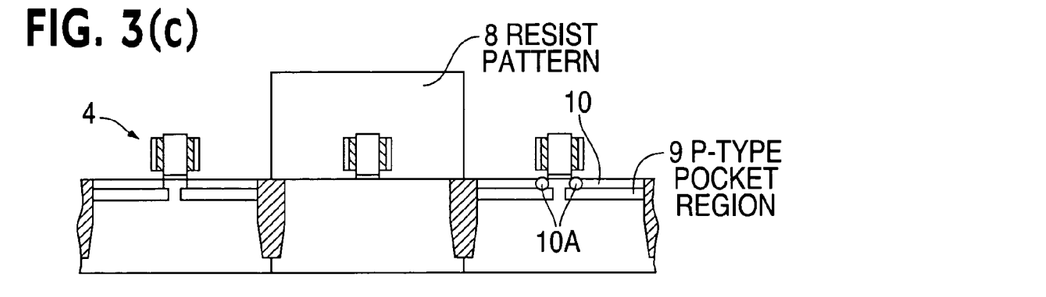

As illustrated in FIG. 3C, a resist pattern 8 for exposing the region to form the nMOS transistor is formed using the photolithography. Using the resist pattern 8 and the gate electrodes 4 as a mask, the p-type impurity is ion-implanted in the semiconductor substrate 1 on both sides of the gate electrodes 4, for example, through the ion implantation from the slanting direction. As the p-type impurity, In and B, for example, may be used. As described above, a p-type pocket region 9 is formed in the semiconductor substrate 1 on both sides of the gate electrodes 4.

Next, for example, with the ion implantation, an n-type impurity is ion-implanted in the semiconductor substrate 1 on both sides of the gate electrodes 4 using the resist pattern 8 and the gate electrodes 4 as a mask. As the n-type impurity, As, for example, may be used. As described above, impurity regions 10 can be formed in the semiconductor substrate 1 on both sides of the gate electrodes 4. The impurity regions 10 include extension regions 10A in the vicinity of the gates electrodes 4, as shown in the drawings.

Next, the resist pattern 8 is peeled. For peeling of the resist pattern 8, an ashing process is, for example, can be used. As the reaction gas for ashing the resist pattern 8, for example, $O_2$ gas alone or a combination of $O_2$ gas and $CF_4$ gas may be used.

Thereafter, a "wet" process, for example, is executed to remove the ashed resist film with a chemical solution. In this wet process, the resist pattern 8 is removed first using an SPM (Sulfuric acid-Hydrogen Peroxide Mixture) solution, for example. Any residue of the resist pattern 8 not removed with the SPM solution is then removed using an APM (Ammonia hydroxide/hydrogen peroxide mixture) solution. The SPM solution is a chemical solution obtained by mixing sulfuric acid and hydrogen peroxide in a ratio, for example, of 4:1. The APM solution is a chemical solution obtained by mixing ammonium hydroxide, hydrogen peroxide, and water in a ratio, for example, of 1:1:5. The resist pattern 8 may be removed as described above.

Figure 3D:
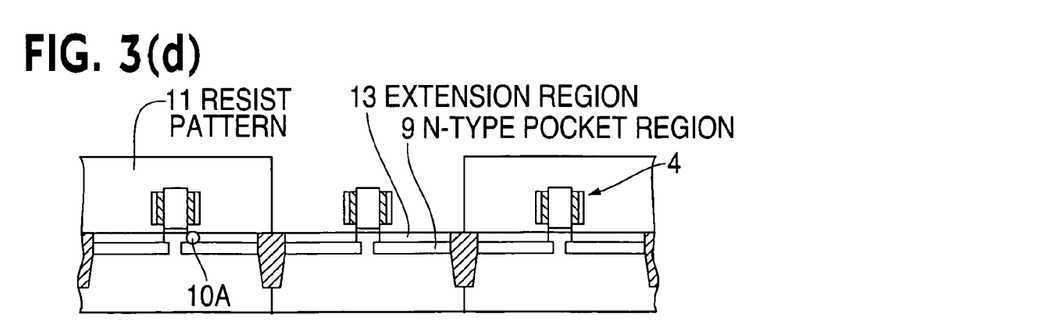

As illustrated in FIG. 3D, a resist pattern 11 for exposing the region to form the pMOS transistor is formed using the photolithography.

Next, for example, with the slanting ion implantation method, the n-type impurity is introduced in the semiconductor substrate 1 in both sides of the gate electrode using the resist pattern 11 and the gate electrode 4 as the mask. As the n-type impurity, Sb, for example, may be used. As described above, an n-type pocket region 12 is formed in the semiconductor substrate 1 on both sides of the gate electrode 4.

Next, for example, with the ion implantation method, the p-type impurity is introduced in the semiconductor substrate 1 on both sides of the gate electrode using the resist pattern 11 and the gate electrode 4 as a mask. As the p-type impurity, for example, boron may be used. As described above, an extension region 13 may be formed in the semiconductor substrateon both sides of the gate electrode 4.

Next, the resist pattern 11 is removed in the same manner as the method for peeling the resist pattern 8.

Next, before performing the heat treatment to activate the dopant impurity in the impurity/extension regions 10, 13, the surface of the semiconductor substrate 1 is cleaned. For the cleaning process, the cleaning process using the APM solution described above and the cleaning process using an HPM (Hydrochloric acid-Hydrogen Peroxide Mixture) solution are conducted. The HPM solution is the chemical solution obtained by mixing hydrochloric acid, hydrogen peroxide, and water in the ratio, for example, of 1:1:5.

Next, the heat treatment is performed to activate the dopant impurities in the extension regions 10, 13 are conducted, for example, with a RTA (Rapid Thermal Annealing) method.

Figure 3E:
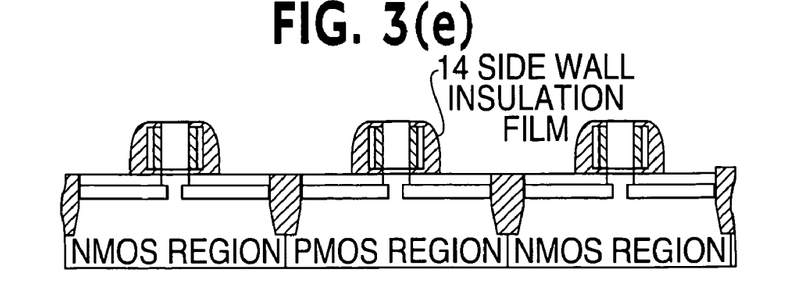

As illustrated in FIG. 3E, a silicon oxide film with a thickness, for example, of 100 nm, is formed on the entire surface, by using,-for example, the evacuated thermal CVD method. Next, the silicon oxide film is etched with the anisotropic etching method. As the etching gas, a hydro fluorocarbon may, for example, be used. After patterning, a side wall insulation film 14 is formed on the laminated structure from the including of silicon oxide film. The side wall insulation film 14 forms the side wall of the gate electrodes 4.

Figure 3F:
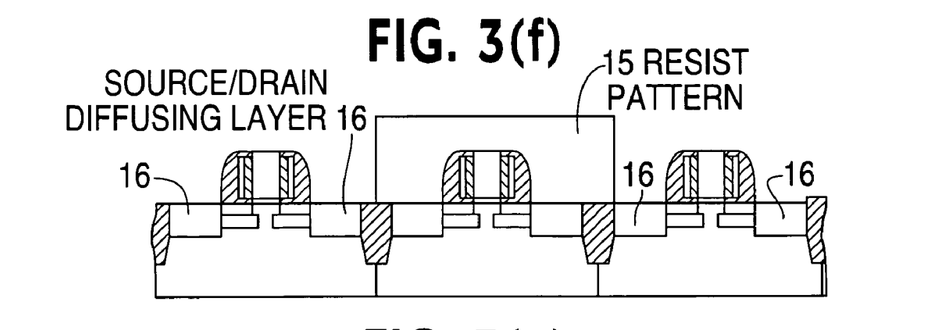

As illustrated in FIG. 3F, a resist pattern 15 is formed to expose a region for the nMOS transistors. The resist pattern 15 is formed using photolithography.

Next, for example, with an ion implantation process, n-type impurities are introduced into the semiconductor substrate 1 using the resist pattern 15, the gate electrodes 4 and the side wall insulation film 14 as a mask. As the n-type impurity, As or P, for example, may be used. With this process, source/drain diffusion regions 16 are formed in the semiconductor substrate 1, on both sides of the gate electrodes 4 having the side wall insulation film 14 formed thereon.

Next, the resist pattern 15 is removed with a method similar to the peeling method used for the resist pattern 8.

Figure 3G:
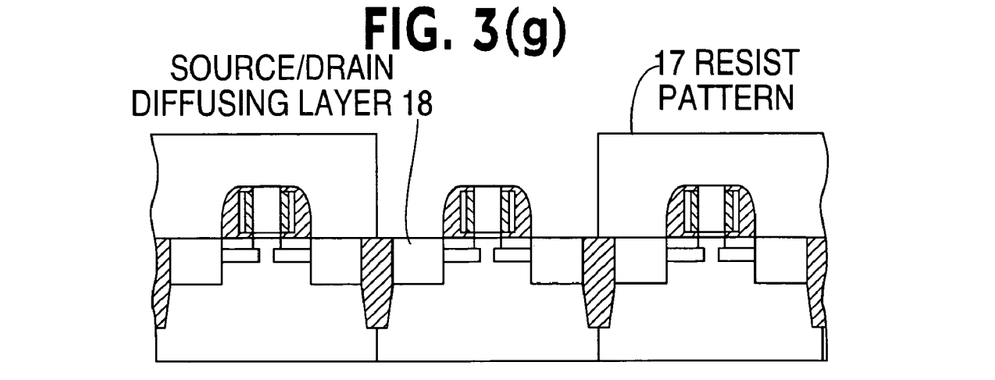

As illustrated in FIG. 3G, a resist pattern 17 is formed to expose a region for the pMOS transistor. The resist pattern 17 is formed using photolithography.

Next, for example, with an ion implantation method, p-type impurities are introduced into the semiconductor substrate 1 using the resist pattern 17, the gate electrode 4 and the side wall insulation film 14 as a mask. As the p-type impurity, boron, for example, may be used. With this process, source/drain diffusion regions 18 are formed in the semiconductor substrate 1, on both sides of the gate electrode 4 having the side wall insulation film 14 formed thereon.

Next, the resist pattern 17 is removed with a method similar to the peeling method used for the resist pattern 8.

Before heat treatment to activate the dopant impurity in the source/drain diffusion regions 16, 18, the semiconductor substrate 1 is cleaned. For the cleaning process, the cleaning process using the APM solution obtained by mixing ammonium hydroxide, hydrogen peroxide, and water in the ratio, for example, of 1:1:5 and the cleaning process using the HPM solution obtained by mixing hydrochloric acid, hydrogen peroxide, and water in the ratio, for example, of 1:1:5 are conducted. Thereby, the surface of semiconductor substrate 1 may be cleaned.

The foregoing describes using the HPM solution after the APM solution. However, it is also possible to use the APM solution after the HPM solution.

Next, the heat treatment is conducted to activate the dopant impurities in the source/drain diffusion regions 16, 18.

Next, as the pre-cleaning process in the silicide forming process described later, the APM process, HPM process, drying process using an organic solvent, DHF process, and spin drying process are conducted.

Here, in the APM process, the semiconductor substrate is cleaned using the batch type cleaning apparatus under the condition that the ratio of $NH_4OH:H_2O_2:H_2O$ be set to 1:2:110 and the temperature is set to about 65° C. Moreover, in the HPM process, the semiconductor substrate is cleaned using the batch type cleaning apparatus under the condition that the mixing ratio of hydrochloric acid, hydrogen peroxide and water is set, for example, to 1:1:5 and the temperature is set to about 65° C. After the APM process and HPM process, cleaning by the distilled water is conducted. In the drying process using an organic solvent, the Marangoni drying process is executed using isopropyl alcohol (IPA). In the diluted hydrofluoric acid process, the semiconductor substrate is cleaned using the single wafer type cleaning apparatus with the constrain that the ratio of $HF:H_2O$ be set to 1:10 and under room temperature. After the DHF process, the semiconductor substrate is cleaned with the water and then dried with the single wafer type spin drying process.

Figure 3H:
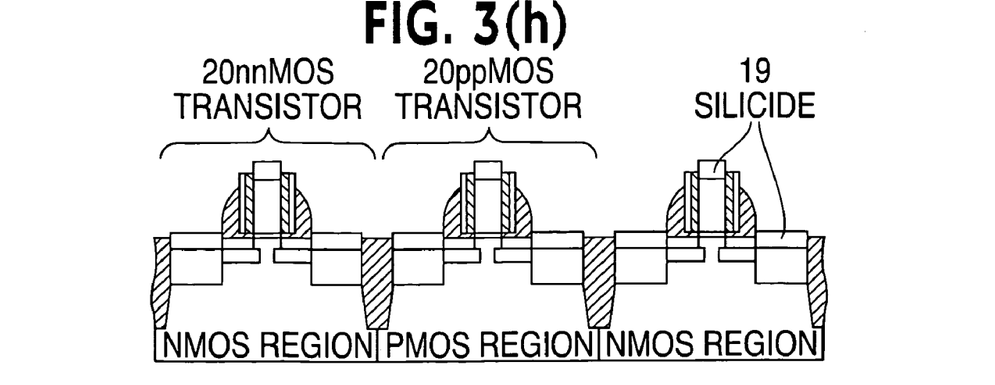

As illustrated in FIG. 3H, cobalt (Co) is formed on the entire surface with the sputtering method. Thickness of the Co film is set, for example, to 5 nm to 10 nm.

Next, a cobalt silicide film is formed by reaction of Co and Si through the heat treatment. Thereafter, Co that has not reacted with Si is removed. Accordingly, a cobalt silicide 19 is formed on the polysilicon gate electrode 4 and source/drain diffusion regions 16, 18.

As described above, the semiconductor device of the present embodiment including an nMOS transistor 20n and a pMOS transistor 20p can be manufactured.

The method of manufacturing a semiconductor device on the basis of the present embodiment is characterized primarily by the procedure of using a kind of chemical solution as well as the method of drying the semiconductor substrate 1. Namely, as the pre-cleaning process in the silicide forming process, the APM process, (HPM process,) DHF process, and spin drying process are conducted in this sequence. Hereafter, the surface conditions of the semiconductor substrate 1 will be discussed in the sequence of the above-mentioned processes.

First, the APM process is introduced primarily to remove particles or organic impurities attached to the surfaces of the semiconductor substrate 1 and the gate electrode 4. The next HPM process is performed primarily to remove very small amount of metals existing on the surfaces of the semiconductor substrate 1 and the gate electrode 4. The sequence of APM process and HPM process may be interchanged. The last DHF process is introduced to remove oxide films existing on the surfaces of the semiconductor substrate 1 and the gate electrode 4. Moreover, the clean surface after the DHF process can be maintained by conducting the spin drying process, in place of the drying process using an organic solvent, following the DHF process.

In the APM process, it is preferable to each at least 1 nm of the polysilicon, which forms the gate electrode 4. At this depth, there is complete removal of the chemical oxide film and the altered layer, which exist on the polysilicon surface. Moreover, the etching rate of polysilicon can be accelerated by cleaning the semiconductor substrate with the high temperature APM solution heated, for example, up to the temperature of 60° C. to 80° C.

Moreover, the HPM process can be preferably conducted using a chemical solution heated to 50° C. to 70° C., because when the high temperature HPM solution is used, the capability to remove contamination by metal is improved. However, if a small amount of metal existing on the surface or the like of the semiconductor substrate 1 is set to the amount which does not result in any problem, the HPM process may be eliminated.

Moreover, the DHF process is preferably conducted with the HF concentration set to 4 wt % or more because this condition is believed to improve the capability for removing the chemical oxide film and altered film, which exist on the polysilicon surface. Moreover, the native oxide film formed on the surface of semiconductor substrate after the DHF process can be preferably controlled in the thickness to 0.1 nm to 0.4 nm. In this case, the native oxide film is formed with the water-cleaning process after the hydrofluoric acid process, but formation of the native oxide film is believed to shorten the water-cleaning time. For example, the water-cleaning time of the bath type cleaning apparatus is set to about 10 minutes, while that of the single wafer type cleaning apparatus, to 2 to 3 minutes because when thickness of the native oxide film is increased, reaction between silicon and cobalt is suppressed at the time of silicide reaction.

Moreover, a hot-water drying process, a heat drying process, a vacuum drying process, or combination thereof may be introduced in place of the spin cleaning process described above. Namely, it is important here to conduct the drying process without using an organic solvent.

In addition, it is preferable that after the drying process, the total amount of organic substances remaining on the wafer surface is 10 pg/cm$^2$ or less. The reason is that, since an organic solvent exists on the silicon surface, reaction between silicon and cobalt is suppressed in the silicide reaction.

Figure 4A:
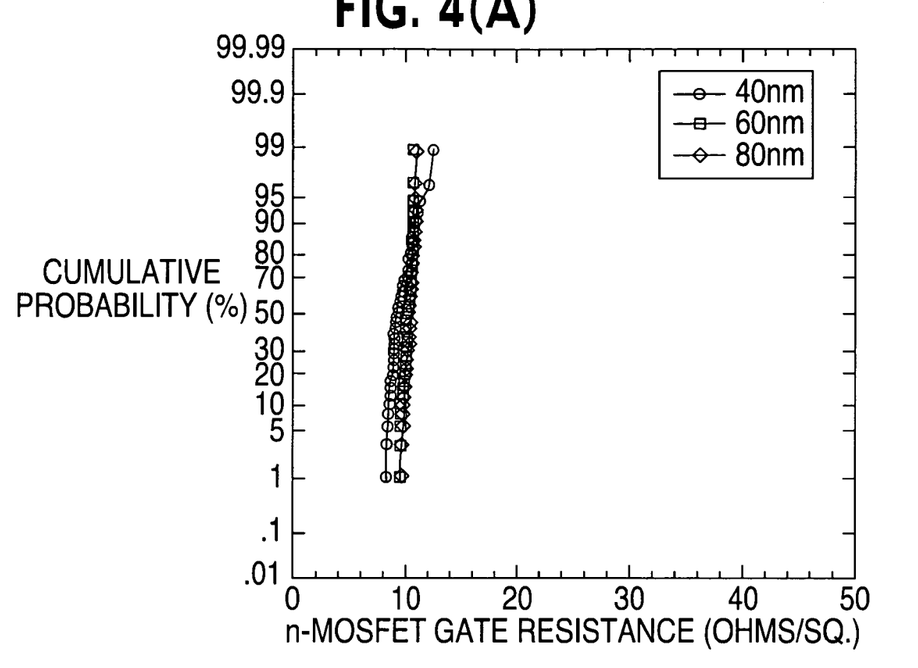
FIG. 4A is a diagram illustrating the cumulative probability of the gate resistance in the wafer surface in an n-channel MOS transistor according to one embodiment of the present invention.
Figure 4B:
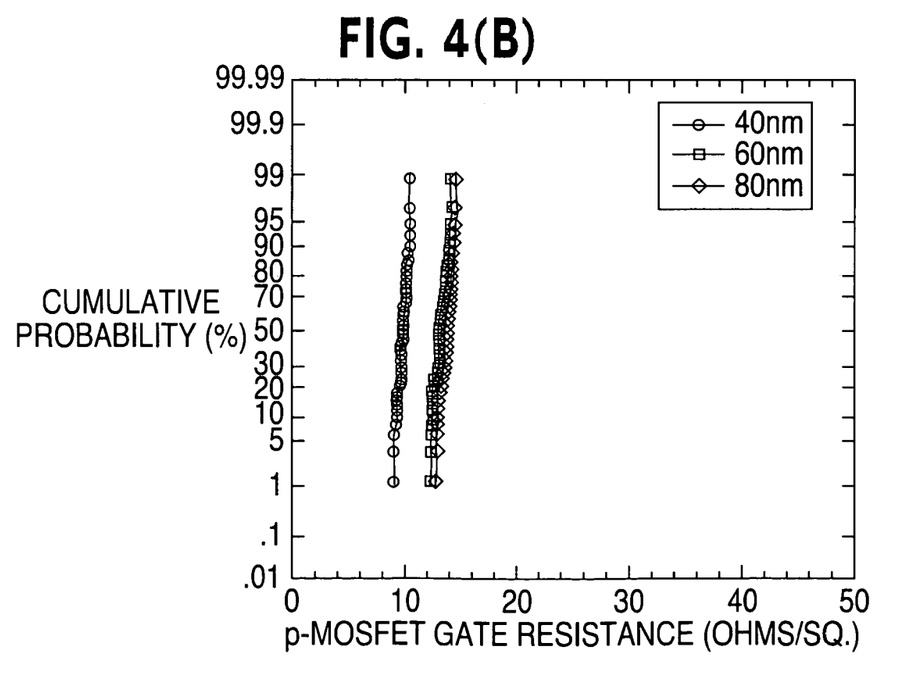
FIG. 4B is a diagram illustrating the cumulative probability of the gate resistance in the wafer surface in a p-channel MOS transistor according to one embodiment of the present invention.

FIG. 4A is a diagram illustrating the cumulative probability in the wafer surface of gate resistance in the n-channel MOS transistor according to one embodiment of the present invention. FIG. 4B is a diagram illustrating the cumulative probability in the wafer surface of gate resistance in the p-channel MOS transistor. In the figures, the cumulative probability is plotted on the vertical axis, while the gate resistance is on the horizontal axis.

The n-channel MOS transistor has been formed with the method described in detail above. That is, to pre-clean the device before the silicide formation process, the APM process, and the HPM process are performed. The device is also subjected to the drying process, which uses an organic solvent, the DHF process, and the spin drying process. Thereafter, the cobalt film forming, heat treatment and wiring process or the like have been conducted and the gate resistances in the gate lengths of 40, 60, and 80 nm of the nMOS transistor have also been measured. As a result, fluctuations in gate resistance at the wafer surface have been suppressed for any gate length.

Figure 5:
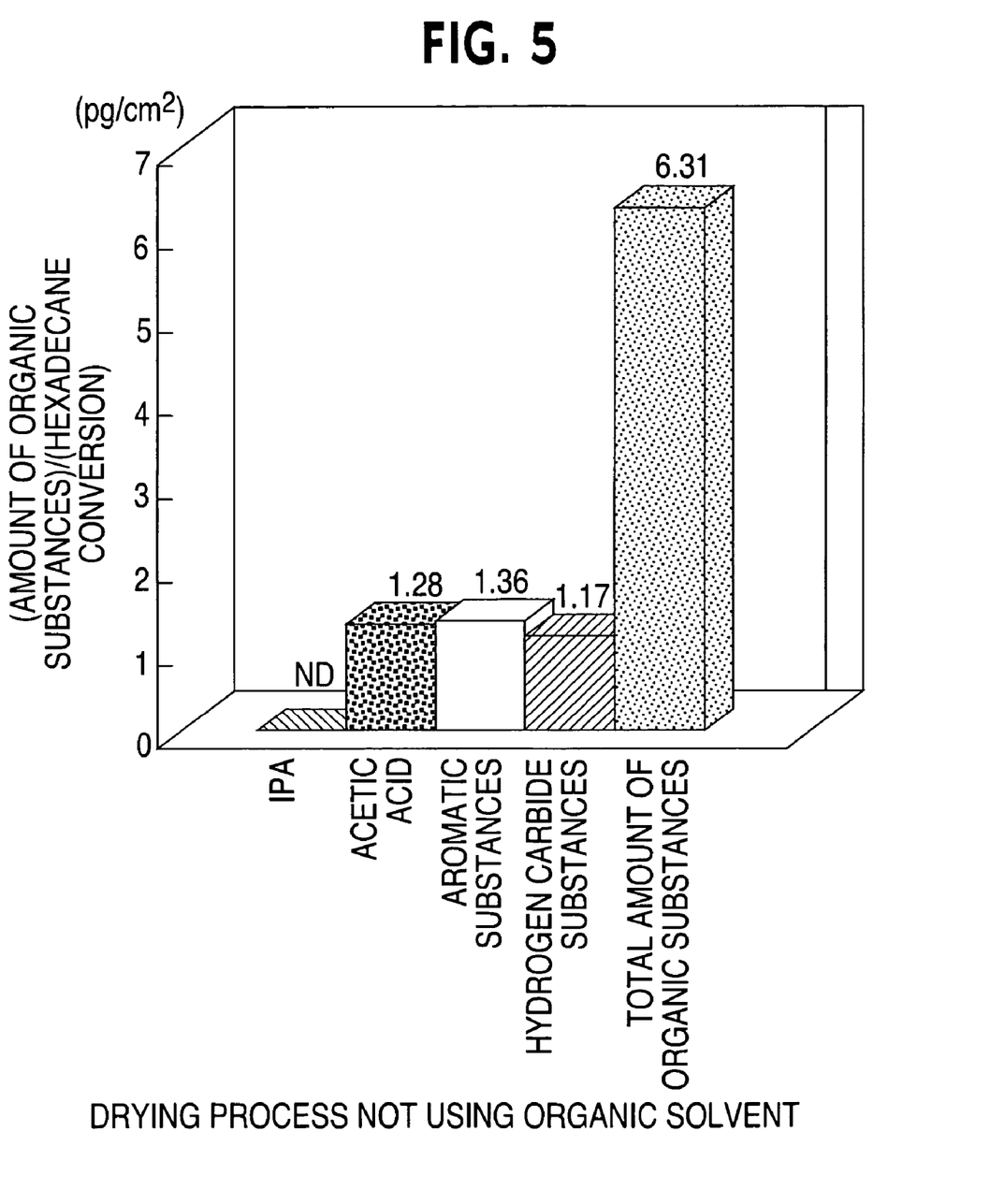
FIG. 5 is a diagram illustrating amount of organic substances existing on the wafer surface after the spin drying process.

FIG. 5 is a diagram illustrating the amount of organic substances existing on the wafer surface after the spin drying process described above. In this figure, the amount of organic substances after the hexadecane conversion is plotted versus the various types of organic substances. The organic substances are measured with GC-MS (gas chromatographic mass analysis). As a result 6.31 pg/cm$^2$ of organic substances have been detected in total, including the four kinds of substances: IPA, acetic acid, aromatic substance, and hydrogen carbide. The amount of organic substances has been reduced to ¼ the amount of organic substances present after the Marangoni drying process, which was 23.08 pg/cm$^2$ as shown in FIG. 2.

As can be seen from FIGS. 2 and 5, the total amount of organic substance can be reduced to about ¼ by utilizing the pre-process described above. Namely, the total amount of organic substance remaining on the wafer surface can be reduced by conducting the drying process not using an organic solvent. Moreover, it can also be inferred from FIGS. 1 and 4 that fluctuations in the gate resistance, for gate having a length to 50 nm or less, can be suppressed through implementation of the pre-process described above.

The present invention is not restricted to the embodiment described above and allows various changes and modifications.

For example, a laminated layer of the offset side wall notch structure and silicon oxide film has been used as the side wall insulation film, but various combinations such as a side wall including single layer or a side wall including two layers or more can also be used.

Moreover, in the embodiment described above, cobalt has been used as the metal to form a salicide layer, but the present invention can also be adapted to form a silicide of titanium, molybdenum, nickel, or an alloy thereof, or a laminated layer of these elements.

In addition, in above embodiment, the APM process (batch system), HPM process (batch system), first drying process (batch system), DHF process (single wafer type), and second drying process (single wafer type) have been conducted in the above sequence, but when the APM process and HPM process are conducted using the single wafer type processing apparatus, the first drying process is unnecessary. The first drying process is required for the drying process to transfer the wafers to the singe wafer type apparatus from the batch type apparatus. Accordingly, various merits such as improvement in the throughput and reduction in the number of apparatuses may be attained by continuously executing the APM process, HPM process, DHF process and drying process not using the organic solvent only with a single unit of processing apparatus.

What is claimed is:

1. A method of manufacturing a semiconductor device comprising:
    removing an organic substance from a semiconductor surface having an oxide film thereon;
    performing a first drying process to dry the semiconductor surface using an organic solvent;
    removing the oxide film from the semiconductor surface;
    performing a second drying process to dry the semiconductor surface without using an organic solvent, the second drying process being performed after removing the oxide film; and
    forming a silicide layer on the semiconductor surface after the second drying process.

2. The method of manufacturing a semiconductor device according to claim 1, wherein the organic substance is removed from the semiconductor surface using ammonium hydroxide and hydrogen peroxide.

3. The method of manufacturing a semiconductor device according to claim 1, further comprising:
removing a metal impurity from the semiconductor surface after removing the organic substance.

4. The method of manufacturing a semiconductor device according to claim 3, wherein the metal impurity is removed using hydrochloric acid and hydrogen peroxide.

5. The method of manufacturing a semiconductor device according to claim 1, wherein the oxide film is removed using hydrofluoric acid.

6. The method of manufacturing a semiconductor device according to claim 1, wherein the second drying process is at least one of a hot water drying process, a heating process, a vacuum drying process, a spin drying process, or combination thereof.

7. The method of manufacturing a semiconductor device according to claim 1, wherein after the semiconductor surface is dried by the second drying process, a total amount of organic substance remaining on the semiconductor surface is 10 pg/cm$^2$ or less.

8. The method of manufacturing a semiconductor device according to claim 1, wherein the semiconductor surface is a polysilicon surface.

9. The method of manufacturing a semiconductor device according to claim 1, wherein the semiconductor surface is a silicon or silicon germanium surface.

10. A method of manufacturing a semiconductor device comprising:
removing an organic substance from a surface of an nMOS gate electrode having an oxide film thereon, the gate electrode comprising silicon and being formed to have a line width of 50 nm or less;
performing a first drying process to dry the surface of the gate electrode;
removing the oxide film on the surface of the gate electrode;
performing a second drying process after removing the oxide film, the second drying process being different from the first drying process, to dry the surface of the gate electrode without using an organic solvent; and
forming a suicide metal on the surface of the gate electrode after performing the second drying process.

11. The method of manufacturing a semiconductor device according to claim 10, further comprising:
forming a side wall insulating film having a single film of an oxide film or a multi film of an oxide film and a nitride film on a side wall of the gate electrode before removing the organic substance.

12. The method of manufacturing a semiconductor device according to claim 10, wherein the organic substance is removed from the gate electrode using ammonium hydroxide and hydrogen peroxide.

13. The method of manufacturing a semiconductor device according to claim 10, further comprising:
removing a metal impurity from the surface of the gate electrode after removing the organic substance.

14. The method of manufacturing a semiconductor device according to claim 13, wherein the metal impurity is removed using hydrochloric acid and hydrogen peroxide.

15. The method of manufacturing a semiconductor device according to claim 10, wherein the oxide film is removed using hydrofluoric acid.

16. The method of manufacturing a semiconductor device according to claim 10, wherein the second drying process is at least one of a hot water drying process, a heating process, a vacuum drying process, a spin drying process, or combination thereof.

17. The method of manufacturing a semiconductor device according to claim 10, wherein after the gate electrode is dried by the second drying process, a total amount of organic substance remaining on the surface of the gate electrode is 10 pg/cm$^2$ or less.

18. The method of manufacturing a semiconductor device according to claim 10, wherein the semiconductor surface is a polysilicon surface.

19. The method of manufacturing a semiconductor device according to claim 10, wherein the semiconductor surface is a silicon or silicon germanium surface.

* * * * *

UNITED STATES PATENT AND TRADEMARK OFFICE
CERTIFICATE OF CORRECTION

PATENT NO. : 7,294,577 B2
APPLICATION NO. : 11/088984
DATED : November 13, 2007
INVENTOR(S) : Junji Oh et al.

It is certified that error appears in the above-identified patent and that said Letters Patent is hereby corrected as shown below:

Title Page, Item 56 Column 2 (Other Publications), Line 2, change "Teachnology," to --Technology,--.

Column 10, Line 1, change "suicide" to --silicide--.

Signed and Sealed this

Sixth Day of May, 2008

JON W. DUDAS
*Director of the United States Patent and Trademark Office*